(12) United States Patent
Saika

(10) Patent No.: US 6,708,320 B2
(45) Date of Patent: Mar. 16, 2004

(54) OPTIMIZATION METHOD FOR ELEMENT PLACEMENT

(75) Inventor: Shunji Saika, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 59 days.

(21) Appl. No.: 10/027,340

(22) Filed: Dec. 19, 2001

(65) Prior Publication Data

US 2002/0116687 A1 Aug. 22, 2002

(30) Foreign Application Priority Data

Dec. 21, 2000 (JP) ........................................ 2000-388910

(51) Int. Cl.[7] .............................................. G06F 17/50
(52) U.S. Cl. .................................. 716/10; 716/8; 716/9; 716/11; 716/2
(58) Field of Search ........................... 716/8, 9, 10, 11, 716/2

(56) References Cited

U.S. PATENT DOCUMENTS 4,495,559 A * 1/1985 Gelatt et al. .................. 700/28
5,510,995 A * 4/1996 Oliver ......................... 700/182

FOREIGN PATENT DOCUMENTS

JP 2000-268073 9/2000

OTHER PUBLICATIONS

Streetman, "Solid State Electronic Devices" 1980, Prentic–Hall, Inc., 2nd edition, pp. 70–79.*
Beichl et al., "(MonteCarlo) Time after Time", Jul. 1997, IEEE Computational Science and Engineering, vol. 4, iss. 3, pp 91–94.*

Beichl et al., "The Metropolis Algorithm", Jan. 2000, IEEE Computational Science and Engineering, vol. 2, iss. 1, pp 65–69.*
"Optimization by Simulated Annealing" S. Kirkpatrick et al., Science vol. 220, No. 4598, 1983, pp.671–680.
"Standard–Cell Placement Optimization using Simulated Phase Translation" K. Kurokawa et al., The 12th Workshop on Circuits and Systems in Karuizawa, Apr. 19–20, 1999, pp.451–456 with the partial English translation.
"An Efficient General Cooling Schedule for Simulated Annealing" M.D. Huang et al., IEEE ICCAD–86 in California, Nov. 11–13, 1986, pp.381–38.
Verification of Translation.

* cited by examiner

Primary Examiner—Matthew Smith
Assistant Examiner—Sun James Lin
(74) Attorney, Agent, or Firm—Merchant & Gould P.C.

(57) ABSTRACT

A method for optimizing element placement in which a processing time by the SA method is shortened and optimality of a solution is improved by generating a thermal equilibrium condition with high efficiency and high precision. The thermal equilibrium condition is generated by performing a Monte-Carlo simulation in which a placement $S_j'$ is accepted as the (j+1)th placement at a probability of w expressed by a relationship: $w=1/(\exp(\Delta E/(k \times T))+1)$, wherein a cost function value for the jth placement $S_j$ generated at one virtual temperature T is calculated as $E_j$, and a cost function value calculated for a placement $S_j'$ obtained by locally changing the placement $S_j$ is varied by only $\Delta E$ into $E_j+\Delta E$, and k denotes a normalization constant at a virtual temperature T.

8 Claims, 4 Drawing Sheets

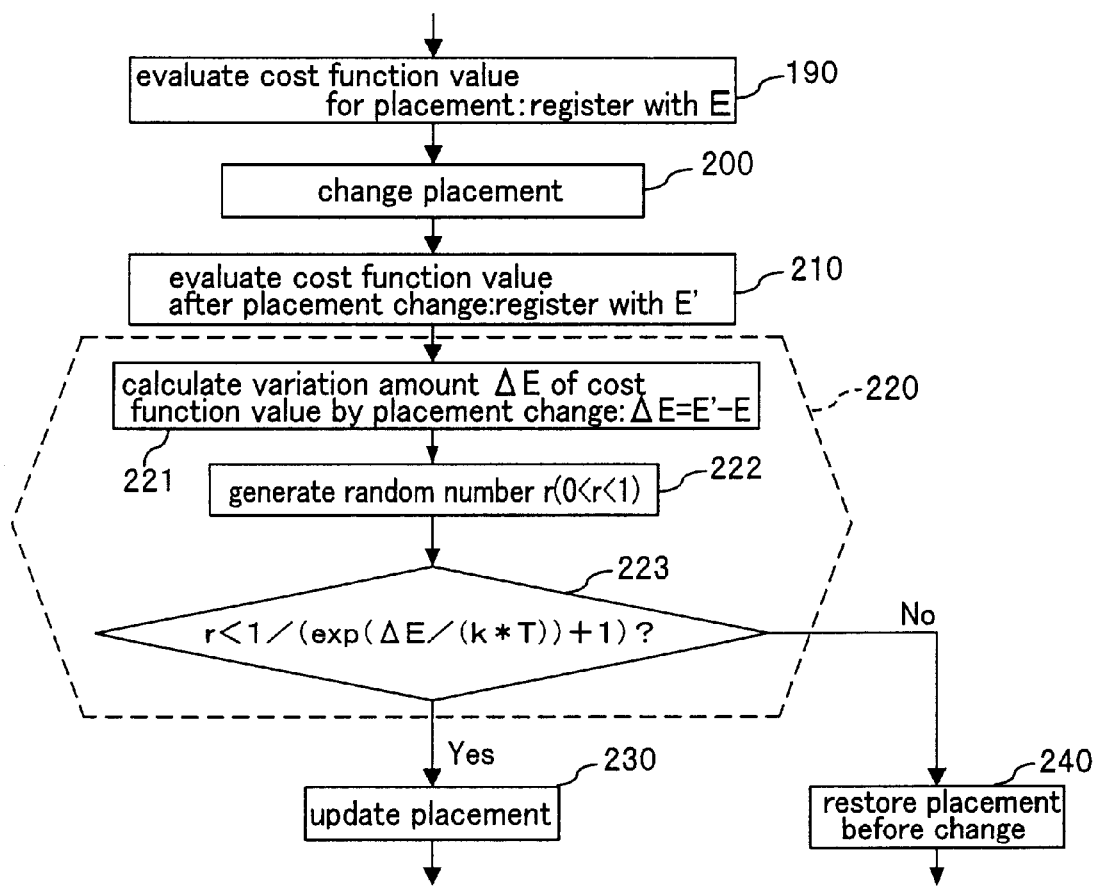
F I G. 3

OPTIMIZATION METHOD FOR ELEMENT PLACEMENT

BACKGROUND OF THE INVENTION

1. Field of the Invention

The present invention relates to a method for automatically optimizing element placement by using a computer in the layout design of a semiconductor device.

2. Description of the Prior Art

The problem of optimization of element placement in a semiconductor results in a problem of searching for a placement to minimize a given cost function. The cost function herein denotes a function in which a value is uniquely determined with respect to one placement and also is referred to as an optimization object function. The cost function is defined appropriately in accordance with individual specific problems. The cost function differs depending on problems, for example, a problem of a placement of standard cells in a block, a problem of a placement of a transistor in the standard cell, or the like.

As a means for heuristically solving the optimization problem of element placement in a semiconductor with a defined cost function to be minimized using a computer, a method of assuming a combinatorial problem to be a physical system and of performing the generation of a thermal equilibrium condition by Monte-Carlo simulation under the control with a virtual temperature parameter is well known (S. Kirkpatrick et al. "Optimization by Simulated Annealing", SCIENCE, Vol. 220, No. 4598, pp. 671–680, 1983). That is, under a constant virtual temperature, by performing the Monte-Carlo simulation in which a random placement change and a judgement whether the placement change is accepted under a rule set by analogy to statistical physics are repeated, a thermal equilibrium condition corresponding to the virtual temperature is generated and the thermal equilibrium condition is generated at each virtual temperature while slowly cooling from a high temperature to a cryogenic temperature (absolute temperature of about 0° C.), and finally an approximate minimum solution to the cost function is obtained. Such a method generally is referred to as a simulated annealing method (hereinafter, referred to as SA method), and broadly used for practically treating actual optimization problems of element placement.

The performance of the SA method is evaluated by a total repetition number of searches, which is a total sum of the repetition number of searches required at the time of Monte-Carlo simulation at all virtual temperatures, and an error between the cost function value of the final solution and the real minimum value of the cost function value. The speed of the optimization processing becomes high as the total repetition number becomes small, and the quality of solution becomes high as the error between the cost function value of the final solution and the real minimum value of the cost function value becomes small.

The technique for generating thermal equilibrium condition by the Monte-Carlo simulation under a constant virtual temperature is one of the important elementary techniques of the SA method. The precision of the thermal equilibrium achieved by the generation of the thermal equilibrium condition largely affects the quality of the final solution of the SA method. Furthermore, if the number of temperature points for observing the thermal equilibrium during the slow cooling process in the SA method is decreased, the effect of the precision of the thermal equilibrium at one temperature on the quality of the final solution is increased. Therefore, whether it is possible to achieve the precise thermal equilibrium by the generation of the thermal equilibrium condition involves not only the quality of the final solution but also the improvement of total processing efficiency in SA method, and is very important in performing the SA method. Therefore, in generating the thermal equilibrium condition, it is desired to generate a precise thermal equilibrium condition with a small repetition number of searches.

The conventional method for optimizing element placement in order to generate the thermal equilibrium conditions includes, for example, a method called a Metropolis method among the Monte-Carlo simulation methods. In generating the thermal equilibrium condition by the Metropolis method, the following Monte-Carlo simulation is carried out. When the cost function value is defined as $E_j$ for a placement $S_j$ that is jth generated at one virtual temperature T, and the cost function value is defined as $E_j + \Delta E$ for a placement $S_j'$ that is locally changed from the placement $S_j$, the placement $S_j'$ is accepted as the (j+1)th placement at a probability of 1 if $\Delta E \leq 0$, while if $\Delta E > 0$, at a probability expressed by exp$(-\beta \times \Delta E)$, wherein k denotes a virtual temperature normalization constant, and $\beta$ denotes an amount that is in proportion to the reciprocal of the virtual temperature and is defined as $\beta = 1/(k \times T)$.

Furthermore, another conventional method for optimizing element placement includes a method in which, in order to generate a thermal equilibrium condition, for example, by converging the average value of the cost function value for a placement generated at one virtual temperature T, the achievement of equilibrium is judged (Kurokawa et al. "Method for optimizing a placement by simulated phase transition method," the 12th workshop (Karuizawa) "Circuit and System" pp. 451–456, 1999). In this method, in judging the convergence of the average value as the statistic, repetition placement search operations in order to generate placements sequentially are composed of repetition operations in a two-level hierarchy consisting of higher and lower levels; and each time a series of repetition searches in each of the lower levels are finished, the convergence of the average value in the lower level is judged.

In a case of the SA method using Monte-Carlo simulation by the Metropolis method for generating a thermal equilibrium condition as in the above-mentioned conventional method for optimizing element placement, since the Metropolis method is one of the approximate techniques for achieving the thermal equilibrium and gives precedence to the relief of a burden on the computer, it has a problem in sacrificing the precision of the thermal equilibrium.

Furthermore, as in the above-mentioned another modification method for element placement, the SA method in which the judgement of the thermal equilibrium is carried out by the convergence of the average value of the cost function values does not conform to the essential meaning of the physical thermal equilibrium. Also this method gives precedence to the relief of the burden on a computer, and thus sacrifices the precision of the thermal equilibrium. Furthermore, the judgement of the thermal equilibrium is carried out in which the convergence of the average value in the lower level while using the repetition operations of the two-level hierarchy is judged, so that it is necessary to increase the number of repetition in the lower level for actually observing the convergence of the average values, thus lowering the efficiency in generating the thermal equilibrium condition.

SUMMARY OF THE INVENTION

With the foregoing in mind, it is an object of the present invention to provide a method for optimizing element placement, which improves a method for judging whether a placement change is accepted at the time of generating thermal equilibrium and a method for achieving thermal equilibrium and generates the thermal equilibrium condition with high efficiency and high precision, thereby shortening the processing time by the SA method and improving the optimality of solution.

In order to achieve the above-mentioned object, a method for optimizing element placement according to the present invention is a method for optimizing element placement in layout design of a semiconductor device, and includes: generating a thermal equilibrium condition by performing a Monte-Carlo simulation at each virtual temperature while varying the virtual temperature that is a parameter for controlling a range in which a solution of element placement on a placement expression space is searched, thereby uniquely calculating a cost function value for evaluating the element placement with respect to an individual placement of elements; and searching an optimal placement solution to minimize the cost function value, wherein: the thermal equilibrium condition is generated by performing the Monte-Carlo simulation in which a placement $S_j'$ is accepted as the (j+1)th placement at a probability of w expressed by the following relationship:

$$w=1/(\exp(\Delta E/(k \times T))+1)$$

wherein a cost function value for the jth placement $S_j$ generated at one virtual temperature T is calculated as $E_j$, and a cost function value calculated for a placement $S_j'$ obtained by locally changing the placement $S_j$ is varied by only $\Delta E$ into $E_j+\Delta E$, and k denotes a normalization constant at a virtual temperature T.

With this method, by judging whether the change is accepted faithfully to the physical understanding of nature, it is possible to generate the thermal equilibrium condition in a middle temperature region in which the reduction amount of the cost function value with respect to the decrease in the virtual temperature is maximum with high precision and to achieve a final solution with higher quality.

In the above-mentioned method for optimizing element placement, it is preferable that in generating the thermal equilibrium condition, judgement of convergence is carried out by a distributed value of the cost function value for the placement generated at one virtual temperature T, and judgement whether the thermal equilibrium is achieved is carried out based on the results of the convergence judgment.

With such a method, for the cost function value, by calculating the distribution that is a macro amount in proportion to a measurable specific heat of the physical system instead of the average of energy of the physical system, which is a non-measurable macro amount, and judging its convergence, the judgement of thermal equilibrium can be carried out faithfully to the physical understanding of nature.

In this case, it is preferable that the generation of the thermal equilibrium condition comprises repetition searches for placements consisting of a two-level hierarchy of higher and lower levels for generating element placements sequentially; judges the convergence of one statistic of the cost function value in the higher level each time a series of repetition placement searches in the lower level is finished; and judges the achievement of the thermal equilibrium based on the result of the convergence judgement.

With this method, even the statistic that is distribution of the cost function value, which conventionally has been difficult to be converged, can be converged by accumulating a set of the cost function values, when accumulation frequency of the cost function values becomes large, even if the fluctuation of the distribution is large around the phase transition temperature in which the optimization advances rapidly. Therefore, it is possible to improve the efficiency in generating the thermal equilibrium condition.

BRIEF DESCRIPTION OF THE DRAWINGS

FIG. 3 is a flow chart showing in detail a process for judging whether the placement change is accepted in a block C shown in FIG. 1.

DESCRIPTION OF THE PREFERRED EMBODIMENTS

The present invention proposes a new method for optimizing element placement using generation of a thermal equilibrium condition by a Monte-Carlo simulation. Hereinafter, the present invention will be described by way of an embodiment with reference to the accompanying drawings.

Figure 1:
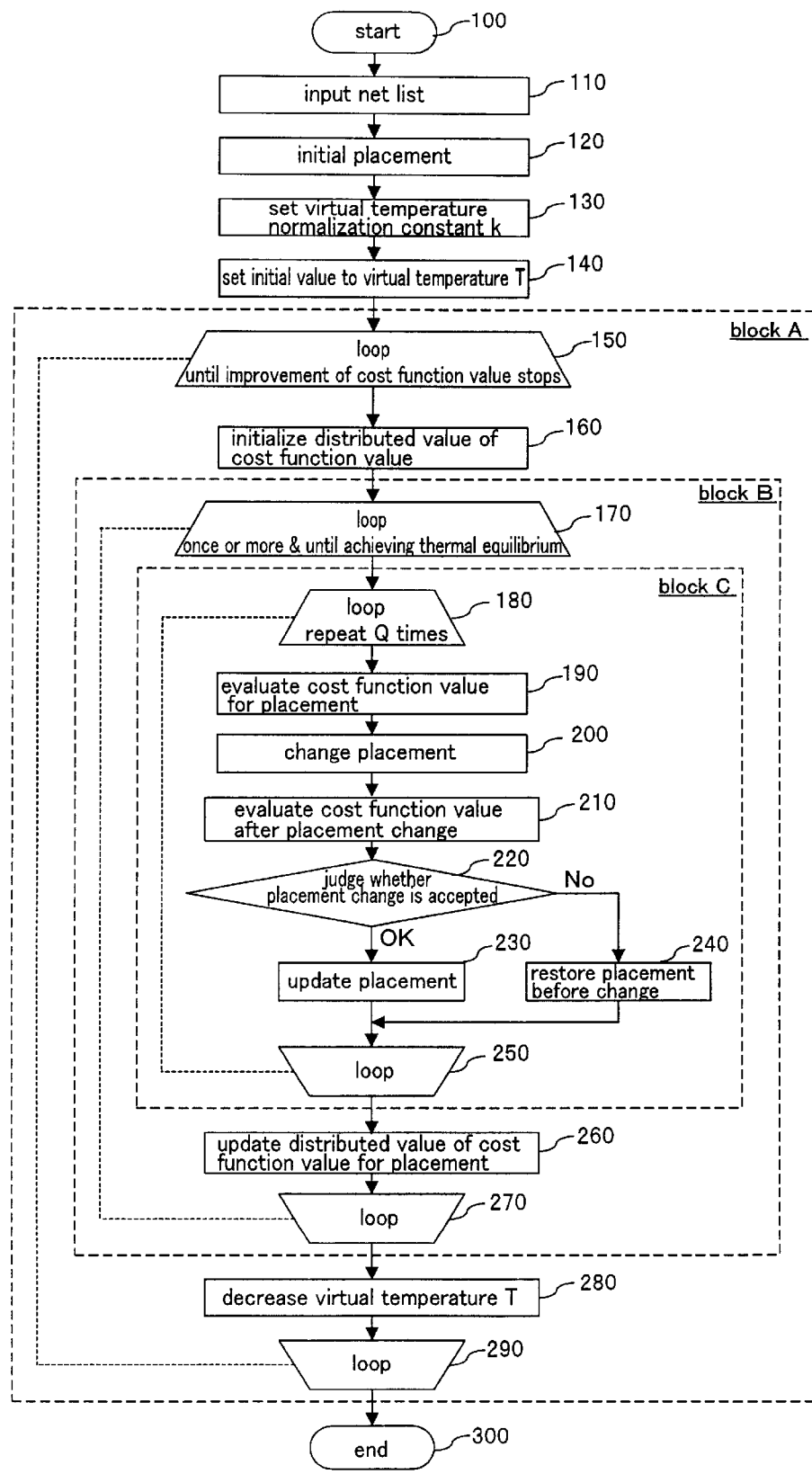
FIG. 1 is a flow chart showing processing procedures of a method for optimizing element placement according to one embodiment of the present invention.
Figure 2:
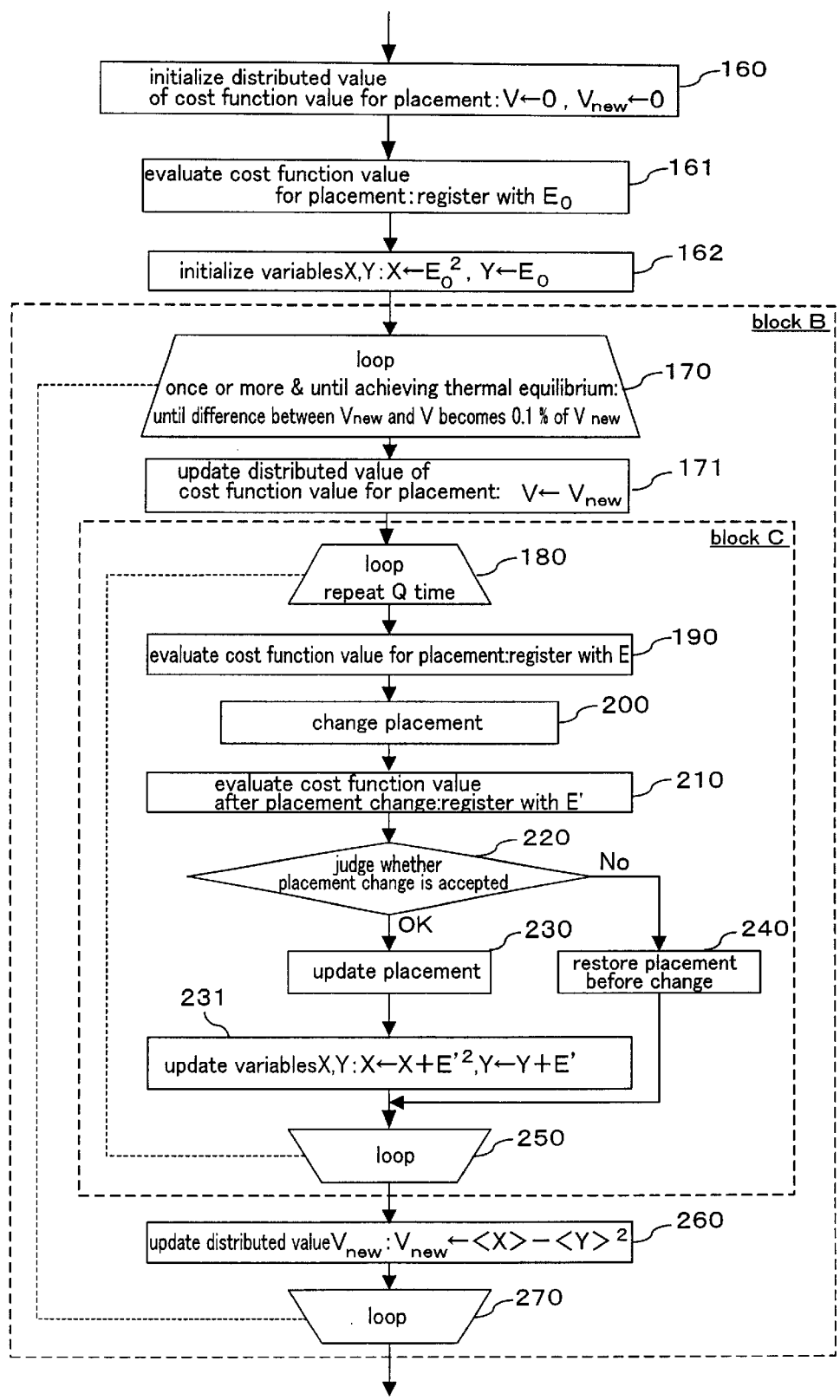
FIG. 2 is a flow chart showing in detail a transition process to a block B shown in FIG. 1 and a process of generating a thermal equilibrium condition in the block B.

FIGS. 1, 2 and 3 are flow charts each showing processing procedures for optimizing the process of element placement according to one embodiment of the present invention. FIG. 1 shows the entire processing procedure; FIG. 2 shows in more detail the processing procedure, focusing attention on a block B of FIG. 1; and FIG. 3 shows in more detail the processing procedure, focusing attention on a part of "judgement whether placement change is accepted" in a block C of FIG. 2.

First, an entire flow of the processing will be explained with reference to FIG. 1 and then details of the processing will be explained with reference to FIGS. 2 and 3.

In FIG. 1, in a step 110, a net list is input, and the attribution of elements and connecting relationship between elements are stored. In a step 120, an initial placement is generated at random. Subsequently, the processing advances to a step 130.

In the step 130, a virtual temperature normalization constant k is determined with respect to a given placement problem. The number of elements of the placement problem is set to N and integer P is set to a sufficiently large value with respect to N. However, typically, P may satisfy $P=N^2$. In the step 130, random placement change is repeated P times with respect to the initial placement generated in the step 120. Herein, when the cost function value of the (j−1)th placement is represented by $E_{j-1}$ and the cost function value of the jth placement is represented by $E_j$, the variation amount of the cost function value due to the jth placement change is represented by $\Delta E=|E_j-E_{j-1}|$. When the average of P times of the variation amount $\Delta E$ (which is a variation amount of the cost function value by single placement change) is represented by <$\Delta E$>, the average value <$\Delta E$> can be regarded as a value representing the variation amount of the cost function value due to the random placement change.

In generating a thermal equilibrium condition in a high temperature region by the SA method (the region in which the virtual temperature value is high), almost all the placement changes are accepted. Therefore, the variation amount of the cost function value in the high temperature region is thought to be substantially equivalent to the variation amount of the cost function value by random placement change. Therefore, the average value <ΔE> represents the variation amount of the cost function value in the high temperature region.

In the step 130, a virtual temperature normalization constant k is introduced so that the high temperature at which almost all the placement changes are accepted is set to be a constant value regardless of individual placement problems. Typically, k may be set to a value expressed by the following Formula 1.

$$k=<\Delta E>/1000 \quad \text{(Formula 1)}$$

In this case, 1000 as a virtual temperature value can be a high temperature such that almost all the random placement changes are accepted. Therefore, when an initial value of the virtual temperature is set in the subsequent step 140, the value 1000 becomes a standard of a high temperature. Moreover, the present invention does not depend on the method for setting the above-mentioned virtual temperature normalization constant k.

Next, in a step 140, the initial value is set to the virtual temperature t. This setting of the initial value is linked to Formula 1 for setting the virtual temperature normalization constant k. In the embodiment of the present invention, the value 1000 is set as a standard. For example, if the initial value is set to the value of the virtual temperature 100000, the SA method is started from an extremely high temperature. On the other hand, if the initial value is set to the value of the virtual temperature 10, the SA method is started from a middle or low temperature region.

Loops in the subsequent steps 150 to 290 represent the process in which the virtual temperature decreases in the SA method (slow cooling process or annealing process) and are loops of the highest hierarchy in the repetition search process. Herein, this part is referred to as a block A. Briefly, the block A mainly includes a block B in charge of generating the thermal equilibrium conditions at one virtual temperature and the step 280 for decreasing the virtual temperature and the step 150 having the condition for terminating the annealing process. The present invention relates to the block B that is a process for generating the thermal equilibrium condition. However, as a matter of convenience, the decrease in the virtual temperatures and the condition for terminating the annealing process will be explained first. Moreover, the present invention is not dependent upon the method for decreasing the virtual temperatures and the condition for terminating the annealing process in the SA method.

First, as a typical example of the method for decreasing the virtual temperatures, a method called "geometric cooling" is employed in which the virtual temperature is decreased at a constant rate. In this method, specifically, between the nth virtual temperature $T_n$ and the (n+1)th virtual temperature $T_{n+1}$, the following relationship is satisfied:

$$T_{n+1}=\alpha \times T_n \quad \text{(Formula 2)}$$

wherein a constant α is defined in the range of 0<α<1.

In other words, in the step 280, $T_{n+1}$ is calculated from $T_n$ by using Formula 2, thereby decreasing the virtual temperature.

In a step 150, in the case where "the block B that is a process for generating the thermal equilibrium condition finishes with the same solutions of the cost function value at ten consecutive points of the virtual temperatures," the judgement is performed that the improvement of the cost function value for the placement stops and the annealing process is finished. Next, in a step 160, the distributed value of the cost function for the placement is initialized.

Hereinafter, the detailed processing in the step 160, a transition process to the block B and the block B will be explained with reference to FIG. 2.

In the process for generating the thermal equilibrium condition shown in block B, the achievement of the thermal equilibrium is judged based on the distributed value of the cost function value for the placement. First, the calculation method of the distributed value of the cost function value for the placement will be explained.

When the cost function value is generally expressed by E, the distributed value V of the value E can be calculated from the following formula 3.

$$V=<E^2>-<E>^2 \quad \text{(Formula 3)}$$

wherein the first term $<E^2>$ of the right side of the formula 3 denotes an average value of the square of the cost function value and the second term $<E>^2$ denotes the square of the average of the cost function value. In FIG. 2, the variable X is a subsidiary variable for calculating $<E^2>$ and stores the sum of the square of the cost function value and the variable Y is a subsidiary variable for calculating $<E>^2$ and stores the sum of the cost function value. Furthermore, in order to judge the convergence of the distributed value, it is necessary to compare the distributed values before and after sampling operations of a grouping of the cost function values E to a degree. In FIG. 2, V denotes a variable for memorizing the distributed value before sampling and $V_{new}$ denotes a variable for memorizing the distributed value after sampling.

Therefore, in the step 160, as a distributed value of the cost function value for the placement, the variables V and $V_{new}$ are initialized (V←0, $V_{new}$←0). In the subsequent step 161, the cost function value for the initial placement in entering the block B that is a repetition loop portion for generating the thermal equilibrium condition is stored. In the step 162, by using the cost function value for the initial placement, the variables X and Y are initialized (X←$E_0^2$, Y←$E_0$).

After the above-mentioned preparation, the block B that is a process for generating the thermal equilibrium condition starts. The block B includes the repetition loops from the step 170 to step 270 and this loop has to be passed through at least once. The loop ends if the distributed value of the sampled cost function value for the placement is converged by the search of placement in the loop. The minimum unit for sampling for calculating the distributed value is a repetition search loop in the lowest level shown by the block C in FIG. 2. The block C includes the steps 180 to 250.

In the first step 170 of the block B, the convergence of the distributed value of the cost function value for the placement is judged based on the comparison of the distributed value V before the block C and the distributed value $V_{new}$ after the block C. As the typical judgement standard, when the absolute value of the difference between V and $V_{new}$ becomes 0.1% of or less than $V_{new}$, it is thought that the distributed value is converged.

Next, in a step 171, when it is judged that the distributed value has not converged, V is updated in preparation for the subsequent judgement.

On the other hand, in the final step 260 in the block B, the distributed value of the group of the latest series of cost function values, which is sampled in the block C, is updated.

Next, the block C that is a repetition search loop in the lowest level and is a minimum sampling unit of the cost function value for the placement will be explained.

In the block C, the placement change and judgement whether change is accepted are repeated Q times (step 180). The typical value of the repetition times Q may be $Q=N^2$. The flow of the placement change and the judgement whether the change is accepted is the part shown in the steps 190 to 231.

In the step 190, before the placement is changed, the cost function value for the current placement is stored and placement change is performed in the step 200. In the step 210, the cost function value after the placement change is calculated. The step 220 shows the portion in which by comparing the cost function values before and after the placement change, the judgement whether change is accepted is performed. As result of the judgement, if the change is accepted, the placement is updated in the step 230 and the cost function value for the new placement is reflected to the variables X and Y in the step 231. On the other hand, in the case where the change is not accepted, the placement before change is restored in the step 240. FIG. 3 shows the detail of the judgement whether change is accepted in the step 220.

In FIG. 3, the step 220 includes the steps 221, 222 and 223.

When the cost function value before the placement change is E (step 190), and the cost function value after the placement change is E' (step 210), the variation amount ΔE of the cost function value due to the placement change is expressed by the following formula 4.

$$\Delta E = E' - E \quad \text{(Formula 4)}$$

This calculation is performed in the step 221. In the case where the variation amount ΔE of the cost function value due to the placement change is obtained, the probability w of accepting the placement change is defined as follows.

$$w = 1/(\exp(\Delta E/(k \times T)) + 1) \quad \text{(Formula 5)}$$

Alternately, when the amount β that is in proportion to the reciprocal of the virtual temperature is represented by Formula 6, the probability w of accepting the placement change can be represented by Formula 7.

$$\beta = 1/(k \times T) \quad \text{(Formula 6)}$$

$$w = 1/(\exp(\beta \times \Delta E) + 1) \quad \text{(Formula 7)}$$

In order to realize the judgement whether the placement change is accepted at the above-mentioned probability w by using a computer, as shown in the step 222, a random number r is generated in the range of 0<r<1 and then the value r and the value w may be compared. As shown in the subsequent step 223, when the value r is smaller than the value w, the placement change is accepted. Thus, it is possible to perform the Monte-Carlo simulation in which the placement change is accepted at a probability of w.

The above-mention is the explanation as to the embodiment of the present invention. The above-mentioned embodiment includes all subject matters of the present invention. Hereinafter, individual subject matters of the inventions will be explained while comparing with the conventional example.

First, the subject matter of the present invention is expressed in the judgement step 220 shown in FIG. 3. For comparison, the configuration of the judgement step according to a conventional Metropolis method is shown in FIG. 4.

Figure 4:
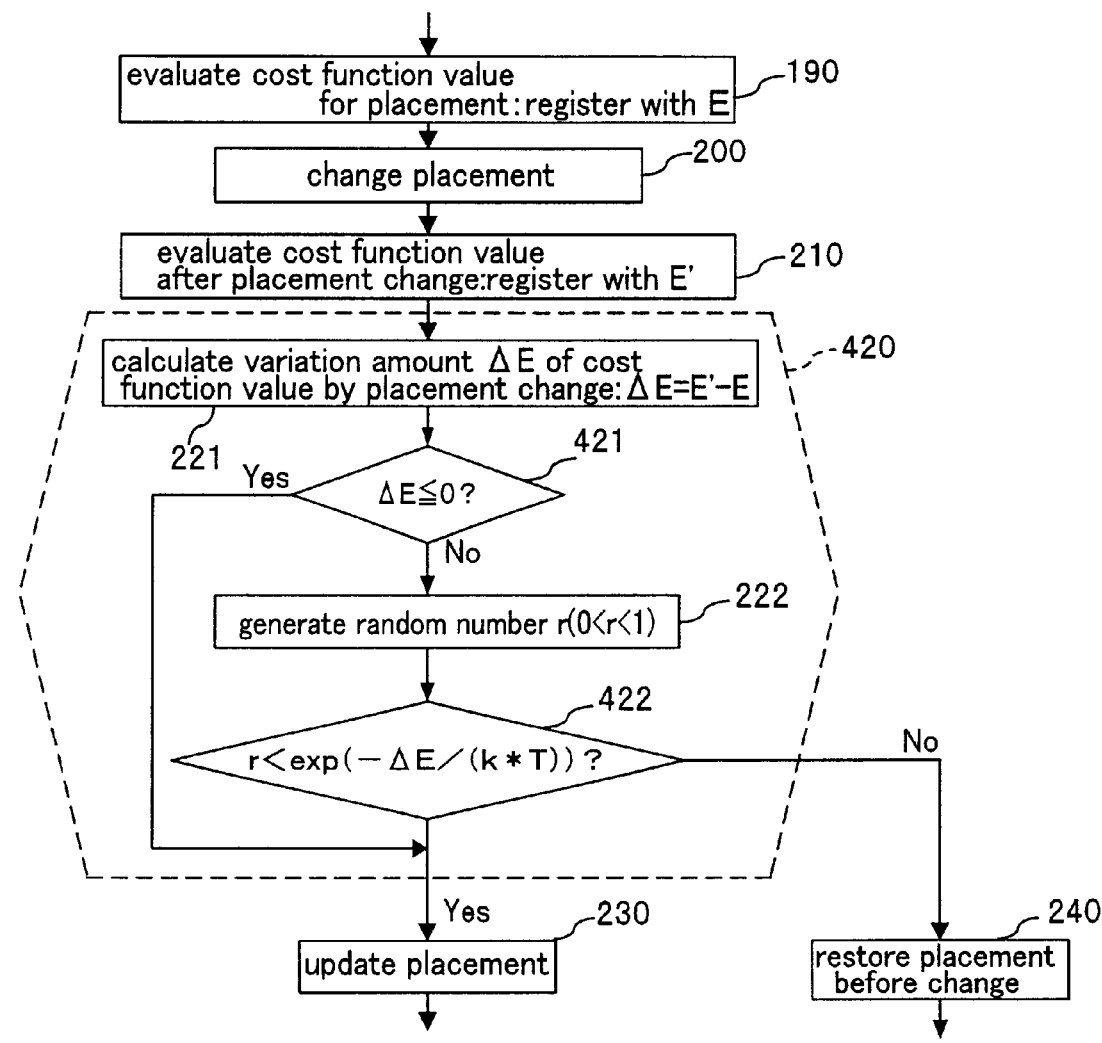
FIG. 4 is a flow chart showing in detail a process for judging whether the placement change is accepted according to a conventional method.

In FIG. 4, the content of a step 420 shows the conventional judgement flow. Namely, when the variation amount ΔE of the cost function value due to the placement change is obtained, the probability $w_M$ of accepting the placement change is defined as follows.

$$w_M = 1 (\text{in the case of } \Delta E \leq 0) \quad \text{(Formula 8)}$$

$$w_M = \exp(-\beta \times \Delta E)(\text{in the case of } \Delta E > 0)$$

In a step 421 of FIG. 4, the comparison between ΔE and 0 is carried out, and in the case of ΔE>0, random number r is used to compare the random number r with the value of exp (−β×ΔE), thereby realizing the Monte-Carlo simulation at the probability of $w_M$.

According to the present invention, the probability w of Formula 7 in the embodiment of the present invention is different from the probability $w_M$ of Formula 8 in the conventional example, however, the probability w is more faithful to the physical analogy in all the temperature regions. For example, if ΔE≦0, $w_M$=1 is satisfied, but w shows a probability value smaller than 1. Furthermore, if ΔE>0, both are apparently different. However, the virtual temperature T is closer to the absolute temperature 0 degree, that is, in the limit wherein the β becomes infinite, w becomes a value that is as close as possible to 1 in the range of ΔE≦0. On the other hand, in the range of ΔE>0, w can be approximately exp (−β×ΔE).

This means that the probability $w_M$ is an approximate value of the probability w at low temperatures. The fact that the probability $w_M$ in Formula 8 becomes an idealized value, that it, 1 in the case of ΔE≦0, has an effect of relieving the burden of calculation by decreasing the number of calculations of the exp function in a computer simulation. However, except for the temperature region of the cryogenic temperature that is near the absolute 0 degree, it is hardly conceivable that microscopic transition occurring in the physical phenomenon in the nature is under the domination of the probability largely biased to a portion with a low energy. From the above discussion, it is shown that the acceptance probability of the placement change should be expressed by the probability w of Formula 7 in the embodiment of the present invention, and the conventional probability $w_M$ is just an approximation to the probability w in the embodiment of the present invention in the cryogenic temperature region. That is, according to the invention described in claim 1, by carrying out the acceptance judgement faithful to the physical understanding of nature, it is possible to improve the precision in generating the thermal equilibrium condition by the SA method.

Next, the subject matter of the present invention is a judgement of thermal equilibrium using a convergence of distributed value of the cost function value for the placement explained with reference to FIGS. 1 and 2. Conventionally, the convergence of the average was used instead of the distribution. Herein, the present invention is intended to be faithful to the physical understanding of nature. That is, the thermal equilibrium of the physical system means that the measurable macro amount falls in a constant value. However, the average value of the energy of the physical system is not a measurable amount. On the other hand, specific heat of the physical system can be measured. The temperature T, specific heat $C_V$ and the energy distribution V satisfy the following relationship:

$$V = <E^2> - <E>^2 \quad \text{(Formula 9)}$$
$$= k \times T^2 \times C_V$$

Namely, the distribution V is a measurable macro amount. Therefore, for judging that the thermal equilibrium is achieved under a constant temperature, it is said to be faithful to the essential meaning of thermal equilibrium to use not an average but the distribution of the cost function value. According to the present invention, by carrying out the judgement of thermal equilibrium, which is faithful to the physical understanding of the nature, the precision in generating the thermal equilibrium condition by the SA method can be improved.

Finally, the subject matter of the present invention relates to a judgement method of thermal equilibrium explained in FIGS. 1 and 2. Herein, a sampling method of the statistic used for the judgment is particularly noted. In the embodiment of the present invention, besides the difference in which the distribution of the cost function value is used as a statistic in the present invention while the average of the cost function value was used as the statistic in the conventional method, the way of selecting the population for calculating the statistic is different. In other words, in the conventional method, only the cost function value, which is sampled by once carrying out the block C that is a lowest level, was used as a population. By comparing the average value of the cost function value obtained by carrying out the block C at a certain timing and the average value of the cost function value obtained by carrying out the block C at the subsequent timing, the average convergence of the cost function value was judged. In order to obtain the convergence of the statistic by this method, it was necessary to carry out the sufficient scale of sampling in the block C. Therefore, it was necessary to set the repetition number Q in the block C to be an extremely large, thus lowering the efficiency in generating the thermal equilibrium condition. In particular, in a case where the distribution was employed as the statistics, there is an extremely large fluctuation of the distribution around the phase transition temperature at which the optimization rapidly proceeds. Accordingly, in the above-mentioned conventional sampling method, Q is deficient, and thus it falls into a state that the convergence never is done.

However, according to the sampling explained in the embodiment of the present invention, the timing of judging the convergence is a performing unit of block C similar to the conventional method. Since a set of the cost function value goes on being accumulated, even if the fluctuation of the distribution is extremely large, when the accumulation frequency is increased, convergence can be done surely. Therefore, the judgement of the thermal equilibrium by the convergence of distribution, which could not be handled in the conventional method, can be realized in accordance with the present invention. Namely, according to the present invention, even statistics that is difficult to be converged can surely be converged. Therefore, it is possible to improve the efficiency in generating the thermal equilibrium condition by SA method.

As mentioned above, according to the present invention, since the thermal equilibrium condition is generated at each virtual temperature that is important during the annealing with high efficiency and high precision, there is a special effect that the optimization of solution can be improved without increasing the processing time by the SA method.

Furthermore, the present methods can be implemented as software executed for example on a general purpose computer as a set of instructions that implements the functions of the method.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A method for optimizing element placement in layout design of a semiconductor device, the method comprising:
generating a thermal equilibrium condition by performing a Monte-Carlo simulation at each virtual temperature while varying the virtual temperature that is a parameter for controlling a range in which a solution of element placement on a placement expression space is searched, thereby uniquely calculating a cost function value for evaluating the element placement with respect to an individual placement of elements; and searching an optimal placement solution to minimize the cost function value, wherein:
the thermal equilibrium condition is generated by performing the Monte-Carlo simulation in which a placement $S_j'$ is accepted as the (j+1)th placement at a probability of w expressed by the following relationship:

$$w=1/(\exp(\Delta E/(k \times T))+1)$$

wherein a cost function value for the jth placement $S_j$ generated at one virtual temperature T is calculated as $E_j$, and a cost function value calculated for a placement $S_j'$ obtained by locally changing the placement $S_j$ is varied by only $\Delta E$ into $E_j+\Delta E$, and k denotes a normalization constant at a virtual temperature T; and
in generating the thermal equilibrium condition, judgement of convergence is carried out by a distributed value of the cost function value for the placement generated at one virtual temperature T, and judgement whether the thermal equilibrium is achieved is carried out based on the results of the convergence judgment.

2. A method for optimizing element placement in layout design of a semiconductor device, the method comprising:
generating a thermal equilibrium condition by performing a Monte-Carlo simulation at each virtual temperature while varying the virtual temperature that is a parameter for controlling a range in which a solution of element placement on a placement expression space is searched, thereby uniquely calculating a cost function value for evaluating the element placement with respect to an individual placement of elements; and searching an optimal placement solution to minimize the cost function value, wherein:
the thermal equilibrium condition is generated by performing the Monte-Carlo simulation in which a placement $S_j'$ is accepted as the (j+1)th placement at a probability of w expressed by the following relationship:

$$w=1(\exp(\Delta E/(k \times T))+1)$$

wherein a cost function value for the jth placement $S_j$ generated at one virtual temperature T is calculated as $E_j$, and a cost function value calculated for a placement $S_j'$ obtained by locally changing the placement $S_j$ is varied by only $\Delta E$ into $E_j+\Delta E$, and k denotes a normalization constant at a virtual temperature T; and
the generation of the thermal equilibrium condition comprises repetition searches for placements consisting of a two-level hierarchy of higher and lower levels for generating element placements sequentially; convergence judgment of one statistic of the cost function value in the higher level each time a series of repetition placement searches in the lower level is finished; and judgment of achievement to the thermal equilibrium based on the results of the convergence judgement.

3. A computing system that performs a method for optimizing element placement in layout design of a semiconductor device, the method comprising:

generating a thermal equilibrium condition by performing a Monte-Carlo simulation at each virtual temperature while varying the virtual temperature that is a parameter for controlling a range in which a solution of element placement on a placement expression space is searched, thereby uniquely calculating a cost function value for evaluating the element placement with respect to an individual placement of elements; and searching an optimal placement solution to minimize the cost function value, wherein the thermal equilibrium condition is generated by performing the Monte-Carlo simulation in which a placement $S_j'$ is accepted as the (j+1)th placement at a probability of w expressed by the following relationship:

$$w=1/(\exp(\Delta E/(k\times T))+1)$$

wherein a cost function value for the jth placement $S_j$ generated at one virtual temperature T is calculated as $E_j$, and a cost function value calculated for a placement $S_j'$ obtained by locally changing the placement $S_j$ is varied by only $\Delta E$ into $E_j+\Delta E$, and k denotes a normalization constant at a virtual temperature T; and in generating the thermal equilibrium condition, judgement of convergence is carried out by a distributed value of the cost function value for the placement generated at one virtual temperature T, and judgement whether the thermal equilibrium is achieved is carried out based on the results of the convergence judgment.

4. A computer data product that contains encoded instructions for implementing a method for optimizing element placement in layout design of a semiconductor device, the method comprising: generating a thermal equilibrium condition by performing a Monte-Carlo simulation at each virtual temperature while varying the virtual temperature that is a parameter for controlling a range in which a solution of element placement on a placement expression space is searched, thereby uniquely calculating a cost function value for evaluating the element placement with respect to an individual placement of elements; and searching an optimal placement solution to minimize the cost function value, wherein the thermal equilibrium condition is generated by performing the Monte-Carlo simulation in which a placement $S_j'$ is accepted as the (j+1)th placement at a probability of w expressed by the following relationship:

$$w=1/(\exp(\Delta E/(k\times T))+1)$$

wherein a cost function value for the jth placement $S_j$ generated at one virtual temperature T is calculated as $E_j$, and a cost function value calculated for a placement $S_j'$ obtained by locally changing the placement $S_j$ is varied by only $\Delta E$ into $E_j+\Delta E$, and k denotes a normalization constant at a virtual temperature T; and in generating the thermal equilibrium condition, judgement of convergence is carried out by a distributed value of the cost function value for the placement generated at one virtual temperature T, and judgement whether the thermal equilibrium is achieved is carried out based on the results of the convergence judgment.

5. The computer data product according to claim 4, which is a computer readable storage medium.

6. A computing system that performs a method for optimizing element placement in layout design of a semiconductor device, the method comprising: generating a thermal equilibrium condition by performing a Monte-Carlo simulation at each virtual temperature while varying the virtual temperature that is a parameter for controlling a range in which a solution of element placement on a placement expression space is searched, thereby uniquely calculating a cost function value for evaluating the element placement with respect to an individual placement of elements; and searching an optimal placement solution to minimize the cost function value, wherein the thermal equilibrium condition is generated by performing the Monte-Carlo simulation in which a placement $S_j'$ is accepted as the (j+1)th placement at a probability of w expressed by the following relationship:

$$w=1/(\exp(\Delta E/(k\times T))+1)$$

wherein a cost function value for the jth placement $S_j$ generated at one virtual temperature T is calculated as $E_j$, and a cost function value calculated for a placement $S_j'$ obtained by locally changing the placement $S_j$ is varied by only $\Delta E$ into $E_j+\Delta E$, and k denotes a normalization constant at a virtual temperature T; and the generation of the thermal equilibrium condition comprises repetition searches for placements consisting of a two-level hierarchy of higher and lower levels for generating element placements sequentially; convergence judgment of one statistic of the cost function value in the higher level each time a series of repetition placement searches in the lower level is finished; and judgment of achievement to the thermal equilibrium based on the results of the convergence judgement.

7. A computer data product that contains encoded instructions for implementing a method for optimizing element placement in layout design of a semiconductor device, the method comprising: generating a thermal equilibrium condition by performing a Monte-Carlo simulation at each virtual temperature while varying the virtual temperature that is a parameter for controlling a range in which a solution of element placement on a placement expression space is searched, thereby uniquely calculating a cost function value for evaluating the element placement with respect to an individual placement of elements; and searching an optimal placement solution to minimize the cost function value, wherein the thermal equilibrium condition is generated by performing the Monte-Carlo simulation in which a placement $S_j'$ is accepted as the (j+1)th placement at a probability of w expressed by the following relationship:

$$w=1/(\exp(\Delta E/(k\times T))+1)$$

wherein a cost function value for the jth placement $S_j$ generated at one virtual temperature T is calculated as $E_j$, and a cost function value calculated for a placement $S_j'$ obtained by locally changing the placement $S_j$ is varied by only $\Delta E$ into $E_j+\Delta E$, and k denotes a normalization constant at a virtual temperature T; and the generation of to thermal equilibrium condition comprises repetition searches for placements consisting of a two-level hierarchy of higher and lower levels for generating element placements sequentially; convergence judgment of one statistic of the cost function value in the higher level each time a series of repetition placement searches in the lower level is finished; and judgment of achievement to the thermal equilibrium based on the results of the convergence judgement.

8. The computer data product according to claim 7, which is a computer readable storage medium.

* * * * *